(12) United States Patent
Zhou et al.

(10) Patent No.: US 7,847,266 B2
(45) Date of Patent: Dec. 7, 2010

(54) DEVICE AND METHOD FOR SELECTING AN EMISSION AREA OF AN EMISSION PATTERN

(75) Inventors: Fang Zhou, Pliening/Landsham (DE); Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 525 days.

(21) Appl. No.: 11/469,753

(22) Filed: Sep. 1, 2006

(65) Prior Publication Data

US 2007/0085018 A1    Apr. 19, 2007

(30) Foreign Application Priority Data

Sep. 6, 2005    (EP)    ................................. 05019361

(51) Int. Cl.
   *H01J 3/14*    (2006.01)
(52) U.S. Cl. ............................ 250/396 R; 250/396 ML; 250/310; 250/492.22; 250/492.3; 250/503.1
(58) Field of Classification Search ............. 250/396 R, 250/396 ML, 400, 492.22, 492.3, 503.1, 250/310
See application file for complete search history.

(56) References Cited

U.S. PATENT DOCUMENTS

| | | | | |
|---|---|---|---|---|
| 3,987,242 A | * | 10/1976 | Gold | 348/673 |
| 4,130,761 A | * | 12/1978 | Matsuda | 250/492.2 |
| 4,198,569 A | * | 4/1980 | Takayama | 250/492.2 |
| 4,427,886 A | * | 1/1984 | Martin et al. | 250/310 |
| 4,468,586 A | * | 8/1984 | Hohn | 313/336 |
| 4,498,952 A | * | 2/1985 | Christensen | 438/20 |
| 4,528,474 A | * | 7/1985 | Kim | 313/346 R |
| 4,820,927 A | * | 4/1989 | Langner et al. | 250/492.2 |
| 4,829,243 A | * | 5/1989 | Woodard et al. | 324/751 |
| 5,061,851 A | * | 10/1991 | Noguchi | 850/43 |
| 5,070,282 A | * | 12/1991 | Epsztein | 315/383 |
| 5,155,412 A | * | 10/1992 | Chang et al. | 315/14 |
| 5,334,282 A | * | 8/1994 | Nakayama et al. | 430/296 |
| 5,430,347 A | * | 7/1995 | Kane et al. | 313/309 |
| 5,466,549 A | * | 11/1995 | Yamada | 430/30 |

(Continued)

FOREIGN PATENT DOCUMENTS

JP    03146951 A    6/1991

(Continued)

OTHER PUBLICATIONS

EP Office Action dated Jun. 2, 2009, European Application No. 05019361.4.

(Continued)

*Primary Examiner*—Bernard E Souw
*Assistant Examiner*—Michael J Logie
(74) *Attorney, Agent, or Firm*—Patterson & Sheridan, LLP

(57) ABSTRACT

A charged particle beam apparatus and a method for measuring an emission pattern of such an apparatus are provided. The apparatus comprises an emitter with an emission pattern including at least two emission peaks, a gun lens, and a diaphragm, wherein the gun lens comprises a deflector unit and the deflector unit is adapted to direct an emission peak of the at least two emission peaks to an opening of the diaphragm to thereby select the emission peak of the at least two emission peaks from the emission pattern.

40 Claims, 7 Drawing Sheets

U.S. PATENT DOCUMENTS

| | | | | |
|---|---|---|---|---|
| 5,535,508 | A * | 7/1996 | Nagai et al. | 29/825 |
| 5,557,105 | A * | 9/1996 | Honjo et al. | 250/310 |
| 5,625,613 | A * | 4/1997 | Kato et al. | 369/112.15 |
| 5,661,307 | A | 8/1997 | Tanaka et al. | |
| 5,854,490 | A * | 12/1998 | Ooaeh et al. | 250/492.23 |
| 5,895,919 | A * | 4/1999 | Frosien et al. | 250/396 R |
| 6,005,247 | A * | 12/1999 | Baum | 250/310 |
| 6,114,708 | A * | 9/2000 | Kojima et al. | 250/492.23 |
| 6,175,122 | B1 * | 1/2001 | Groves et al. | 250/492.23 |
| 6,188,167 | B1 * | 2/2001 | Endo et al. | 313/309 |
| 6,252,344 | B1 * | 6/2001 | Ooae et al. | 313/413 |
| 6,392,333 | B1 * | 5/2002 | Veneklasen et al. | 313/361.1 |
| 6,429,596 | B1 * | 8/2002 | Jamison et al. | 315/111.81 |
| 6,465,783 | B1 * | 10/2002 | Nakasuji | 250/311 |
| 6,489,621 | B1 * | 12/2002 | Frosien | 250/397 |
| 6,495,841 | B1 * | 12/2002 | Ando et al. | 250/492.23 |
| 6,555,830 | B1 * | 4/2003 | Mankos et al. | 250/492.2 |
| 6,573,519 | B1 * | 6/2003 | Takemoto | 250/492.22 |
| 6,576,908 | B1 * | 6/2003 | Winkler et al. | 250/396 R |
| 6,667,486 | B2 * | 12/2003 | Ohta et al. | 250/492.22 |
| 6,768,125 | B2 * | 7/2004 | Platzgummer et al. | 250/492.22 |
| 7,279,686 | B2 * | 10/2007 | Schneiker | 250/396 R |
| 7,397,031 | B2 * | 7/2008 | Shinada et al. | 250/310 |
| 7,468,517 | B2 * | 12/2008 | Frosien et al. | 250/396 R |
| 7,507,956 | B2 * | 3/2009 | Frosien et al. | 250/305 |
| 2003/0155509 | A1 * | 8/2003 | Nakasuji et al. | 250/310 |
| 2005/0048383 | A1 * | 3/2005 | Taniguchi et al. | 430/5 |
| 2005/0072941 | A1 * | 4/2005 | Tanimoto et al. | 250/492.22 |
| 2006/0071175 | A1 * | 4/2006 | Kim et al. | 250/396 R |
| 2006/0076866 | A1 * | 4/2006 | Terui et al. | 313/309 |
| 2006/0243918 | A1 * | 11/2006 | Aloni et al. | 250/492.2 |
| 2007/0145266 | A1 * | 6/2007 | Cohen et al. | 250/310 |
| 2009/0008579 | A1 * | 1/2009 | Takeya et al. | 250/492.23 |

FOREIGN PATENT DOCUMENTS

| | | |
|---|---|---|
| JP | 11265071 A | 9/1999 |
| JP | 2002-279921 | 9/2002 |
| JP | 2005026026 A | 1/2005 |
| JP | 2005032508 A | 2/2005 |
| JP | 2005032508 A * | 2/2005 |
| JP | 2005116743 A | 4/2005 |
| JP | 2005197336 A | 7/2005 |
| WO | WO 9848443 A1 * | 10/1998 |
| WO | 0126134 A1 | 4/2001 |
| WO | WO-2004055856 A2 | 7/2004 |
| WO | WO-2005024890 A1 | 3/2005 |

OTHER PUBLICATIONS

Office Action dated Jun. 29, 2009 for Japanese Patent Application No. 2006-239981.

Final Office Action dated Oct. 26, 2009 for Japanese Patent Application No. 2006-239981.

* cited by examiner (a)

(b)

(c)

DEVICE AND METHOD FOR SELECTING AN EMISSION AREA OF AN EMISSION PATTERN

CROSS-REFERENCE TO RELATED APPLICATION

This application claims priority to European Patent Application No. 05019361.4, filed Sep. 6, 2005, which is herein incorporated by reference.

FIELD OF THE INVENTION

Embodiments of the present invention generally relate to a charged particle apparatus and, more particularly, to charged particle emitters having a noncontinuous emission pattern.

BACKGROUND OF THE INVENTION

Charged particle beam apparatuses are used in a plurality of industrial fields including, but not limited to, inspection of semiconductor devices during manufacturing, exposure systems for lithography, detecting devices, and testing systems. There is a high demand for structuring, testing, and inspecting specimens within the micrometer and nanometer scale. Micrometer and nanometer scale process control, inspection, or structuring is often done with charged particle beams, such as electron beams. Charged particle beams offer superior spatial resolution compared to, for example, photon beams due to their short wavelengths.

Besides resolution, throughput is an issue for such devices. Since large substrate areas may have to be patterned or inspected, a throughput larger than 10 $cm^2$/min, for example, may be desired. In charged particle beam devices, the throughput depends on the charged particle beam current. Thus, there is a need for increasing the beam current. Generally, for the following discussion, there is no need for distinguishing between secondary electrons, back scattered electrons, and Auger electrons. Therefore, the three types together, for simplicity, will be referred to as "secondary electrons."

In view of the desire for increased charged particle beam currents, charged particle beam emitters, such as field emission emitters, have an enormous potential due to their high brightness. Further, these emitters have a small source size and low energy spread. A (cold) field emitter typically includes a crystal of tungsten formed to a very narrow point which is mounted to a loop of tungsten wire. The very narrow point is also frequently referred to as an emitter tip. When applying a voltage to the cold field emitter, a very strong electric field is formed at the emitter tip due to its small radius of curvature. The strong electric field enables the electrons to pass the potential barrier between the metal and the vacuum in which the cold field emitter is placed. Accordingly, the established electric field is often referred to as an electric extractor field because it causes the electrons to be "extracted" from the emitter tip.

Generally, crystalline field emitters have different emission areas corresponding to different crystal surfaces or orientations on the small tip. The beam current and the emission stability of a field emission gun can depend strongly on the emission area of the field emitter. FIG. 1 shows a typical emission pattern of a [110] oriented single crystalline tungsten emitter obtained by using a field electron microscope (FEM). The brightness of different emission areas varies significantly because of the different work functions for the different crystal surfaces. In addition, the stability of the emission current differs depending on the emission corresponding to the crystal orientation. To enhance the brightness of a field emitter an additional coverage may be applied in order to reduce the work function of certain crystal surfaces, for example W(100)-ZnO Schottky emitter.

Prior art devices tend to determine the emission area by a rough mechanical alignment of the position and the crystal orientation.

In practice it is desired to improve both the brightness and the stability of the charged particle beam current, especially in the case of cold field emission.

SUMMARY OF THE INVENTION

One embodiment of the invention provides for a charged particle beam apparatus. The charged particle beam apparatus generally includes an emitter with an emission pattern including at least two emission peaks, a gun lens, and a diaphragm wherein the gun lens comprises a deflector unit and the deflector unit is adapted to direct an emission peak of the at least two emission peaks to an opening of the diaphragm to thereby select the emission peak of the at least two emission peaks from the emission pattern.

Another embodiment of the invention provides for a charged particle beam apparatus. The charged particle beam apparatus generally includes an emitter with an emission pattern including at least two emission peaks, a gun lens, a deflector unit, and a diaphragm wherein the gun lens and the deflector unit are positioned within a distance of about 50 mm or less from the emitter.

Yet another embodiment of the invention is a method for measuring an emission pattern of an emitter. The method generally includes the steps of providing an emitter with an emission pattern including at least two emission peaks, deflecting the emission pattern of a charged particle beam over an opening of a diaphragm, measuring a value correlated to a charged particle current passing through the diaphragm, and evaluating the value as a function of the deflected emission pattern.

Yet another embodiment of the invention is a method of selecting an emission peak of an emission pattern. The method generally includes the steps of providing an emitter with an emission pattern including at least two emission peaks, electing an emission peak of the emission pattern, and deflecting a charged particle beam having the emission pattern to allow the elected emission peak to pass through an opening of a diaphragm.

Yet another embodiment of the invention provides for a charged particle beam column. The charged particle beam column generally includes a charged particle beam apparatus and a specimen stage for holding a specimen to receive a charged particle beam. The charged particle beam apparatus generally includes an emitter with an emission pattern including at least two emission peaks, a gun lens, and a diaphragm wherein the gun lens comprises a deflector unit and the deflector unit is adapted to direct an emission peak of the at least two emission peaks to an opening of the diaphragm to thereby select the emission peak of the at least two emission peaks from the emission pattern.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
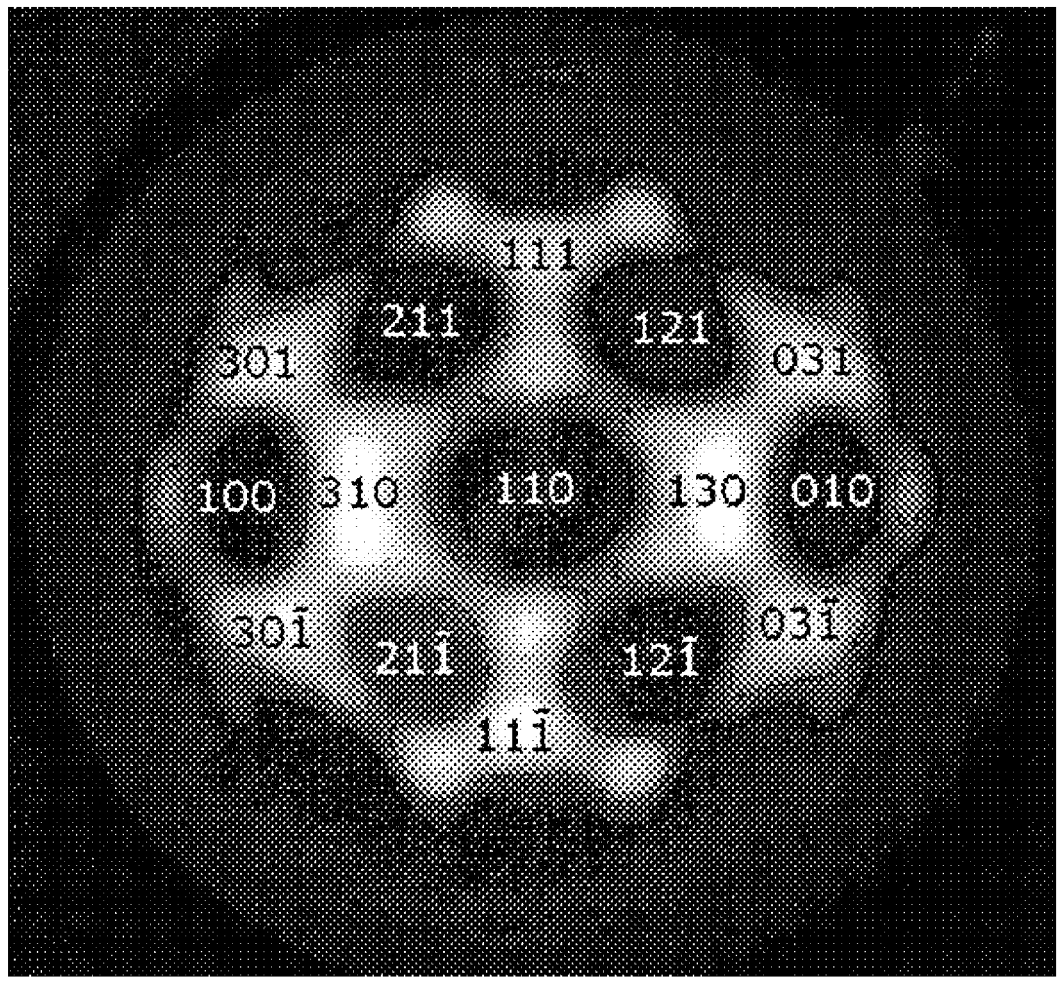
FIG. 1 shows a prior art emission pattern of a field emission tip, wherein the brightness of different crystal surfaces, which are marked with indices, are different.

Reference will now be made in detail to various embodiments, examples of which are illustrated in the drawings. In the figures and the description that follow, like reference numerals refer to similar elements. The example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations.

In particular, the following embodiments will be described with reference to electron beams and field emitters, specifically cold field emitters. This is not to be understood as a limitation to the invention. The invention may also be applied to other charged particles and other types of emitters with non-continuous emission patterns. For example, nanotubes and other functional materials—which have extremely high brightness but no continuous emission pattern—may also be used. Further, instead of electrons as charged particles, aspects of the present invention may also be used for ions and respective ion emitters having an emission pattern with different distinct emission areas.

Figure 2:
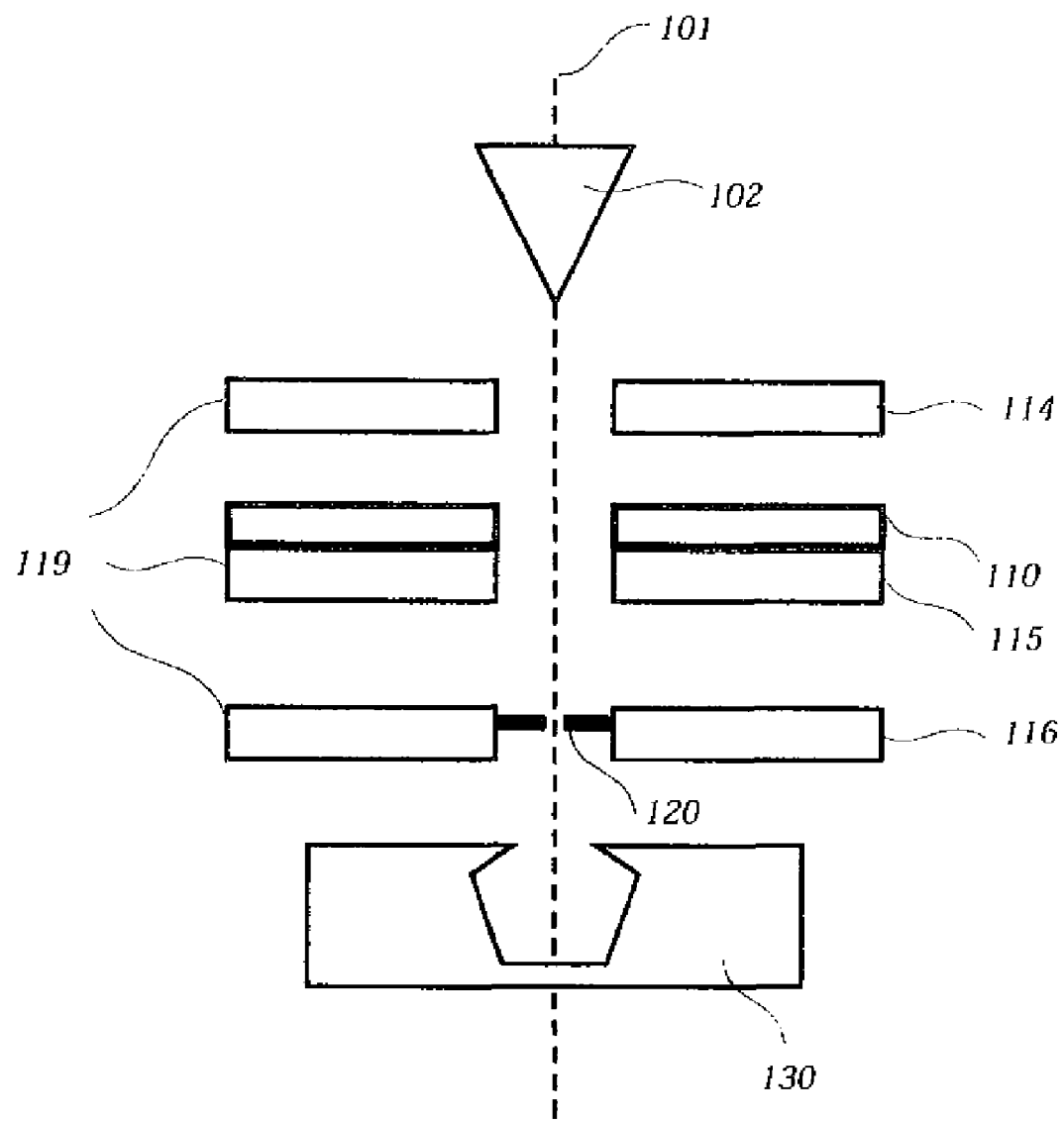
FIG. 2 shows a gun region of a charged particle beam device according to an embodiment of the present invention.

The first embodiment will now be described with respect to FIG. 2. FIG. 2 shows a field emitter 102 that may be essentially located on optical axis 101. The field emitter 102 may have an emission characteristic comparable to the pattern shown in FIG. 1. The emission of emitter 102 may be based on a potential difference between the emitter and the extractor 114, as well as the very small radius of the emission tip, resulting in strong electric fields capable of extracting electrons from the emission tip of the emitter 102.

In order to select the emission of one emission area of the emission pattern of the emitter 102, a deflector unit 110 may be provided. The deflector unit 110 may be a multipole element, which may be electrostatic, magnetic, or combined magnetic-electrostatic. The deflector 110 may be disposed close to the emitter 102. This is to be understood so that the deflector unit may be positioned within a distance of 25 mm or less to the emitter tip, preferably within a distance of 20 mm or less. Therefore, the deflector 110 may be placed in the same ultrahigh vacuum (UHV), which may be required for the field emitter and may be in the range of about $1*10^{-8}$ mbar ($0.75*10^{-8}$ Torr) or less. In order to obtain a reasonably stable emission from a field emitter, an ultra high vacuum may be required which is typically better than $1.33*10^{-7}$ Pa ($10^{-9}$ Torr) and, in particular, better than $1.33*10^{-9}$ Pa ($10^{-11}$ Torr). Principally, the lower the pressure is, the better the vacuum should be. Because of these vacuum conditions in which the deflector unit 110 may be placed, typically, but not limited to the specific embodiment, the deflector unit 110 may be preferred to be an electrostatic multi pole element.

The multipole element may include at least three electrodes and may be typically provided in the form of a quadrupole with four electrodes. Also an octupole with eight electrodes may be used, as described in respect to FIGS. 4a to 4c.

The multipole elements may enable the deflector to scan the electron beams two-dimensionally in a plane perpendicular to the optical axis 101. Thereby, the emission areas of the emission pattern of the emitter 102 (e.g., a cold field emitter) may be scanned over the diaphragm 120, which may be integrated into electrode 116. By scanning the emission areas over the diaphragm 120, which may form a small aperture stop, one of the different emission areas of the emission pattern may flexibly be selected. The diaphragm or aperture may have an opening with a diameter of, for example, about 1 μm to 50 μm.

The different emission areas may be irregular but each may provide high coherent monatomic field emission. Each of these emission spots, which can be seen illustratively in FIG. 1, has a specific characteristic. Some of them may provide a very high brightness, that is a high beam current, a very good stability of the beam current, or an advantageous beam shape. Being able to flexibly select one of the emitted spots corresponding to a specific emission area of the emitter may allow selection of the individual electron beam as required for a specific application. Generally, an emission area with high brightness and high stability may be chosen.

The components 114, 115 and 116 may form a gun lens 119, which may typically be used as a condenser lens. Thereby, the arrangement of three electrodes may be applied as an Einzel-lens or as an immersion lens. The different types of lenses may also be used for other embodiments described with respect to the other figures.

In the embodiment shown in FIG. 2, the extractor 114, the deflector unit 110, and the electrode 116, which includes the diaphragm 120, are integrated in the gun lens 119. For all embodiments shown with respect to FIGS. 2 to 9, the gun lens includes the deflector unit and the other components. These components may be integrated into the gun lens 119. According to a typical option, the deflector unit 110 and portions of the other components may form an electrode of the gun lens 119. Thereby, these components may be integrated, as well, but then may, however, replace a component of the gun lens 119.

In view of the above, the gun lens 119 and the deflector unit 110 may be located close to the field emitter 102. Typically, and independent of specific embodiments described herein, the gun/condenser lens 119 and the deflector unit 110 may be positioned within a distance of 25 mm or less to the emitter tip, preferably within a distance of 20 mm or less.

The following two advantages may be achieved by placing the gun lens 119 and the deflector unit 110 close to the emitter 102. First, high current applications may suffer from electron-electron-interaction in the primary electron beam. The electron-electron-interaction may increase the energy width of a charged particle beam and, thereby, chromatic aberrations. Further, stochastic scattering between electrons may blur the electron beam. Thus, it may be considered advantageous to block parts of the emitted electrons as close to the emitter 102 as possible. This may reduce the electron-electron-interaction along the rest of the electron beam path.

Second, charged particle sources, like cold field emitters, which have a very small tip, or other arrangements with sources also having a small virtual size, such as cold field emitter (CFE) scanning electron microscopes (SEMs) or focused ion beams (FIBs), typically use a small demagnification of the electron beam scanned over a specimen. Therefore, telecentric arrangements with a magnification (Mag) of 1:1, or a Mag<10, are widespread for applications with sources having a small virtual size. These arrangements often, but not necessarily avoid cross-overs, for example, after the gun lens. Avoiding cross-overs may reduce electron-electron-interactions. As an example, there will be no crossover after the emitter tip until the charged particle beam is focused on the specimen. In the event of a small demagnification, the aberrations introduced by the condenser lens may have increasing influence. Consequently, these aberrations may be intended to be reduced by a small focal length of the condenser lens. This may be realized by the above-mentioned position close to the emitter 102.

Embodiments of the present invention may further enable precisely localizing the emission areas suitable for the respective needs that are, generally, high brightness and high stability. Additionally, the alignment of the electron beam of the system may be simplified. Further, different emission spots with different brightness can be chosen. Thereby, the beam current may be varied for different applications. As a result, other arrangements such as multiple aperture plates or the like may be omitted. A further advantage may be that inexpensive polycrystalline field emitters may be utilized. For example, a field emission tip etched from a polycrystalline tungsten wire may deliver, in most cases, an emission pattern similar to the pattern shown in FIG. 1. As already mentioned above, emission from nanotubes and of functional materials that have extremely high brightness, but no continuous emission pattern, may also be used with embodiments of the present invention.

Returning now to the embodiment of FIG. 2, a detector 130 is shown below the diaphragm 120. In this embodiment, a Faraday-cup-like detector may be used after the small aperture. The Faraday-cup may detect the amount of electrons passing through the small aperture. The Faraday-cup may be moved into the beam path that is on the optical axis 101 to conduct the following method.

An emission pattern of the field emitter may be projected on the plane of the diaphragm or aperture 120. Thereby, the deflector unit may scan (sequentially) the entire pattern through the aperture 120. Detector 130 may measure the charge or the current. Using the scan signal and the measured charge or current, an image of the emission pattern may be obtained. Thereby, it may be beneficial to use the gun lens to change the resolution and/or the magnification of the measured pattern. The measured pattern may be evaluated with respect to the desired properties such as brightness, stability, or the like. The deflector unit 110 may be used to select certain emission areas when the charged particle beam apparatus is operated under normal conditions for testing purposes, inspection purposes, or other applications.

Instead of the Faraday-cup-type detector, which may directly detect the amount of electrons that pass through the diaphragm, other detectors may be utilized. For instance, the amount of electrons may also be measured indirectly. An example of an indirect measurement for the current passing through the diaphragm will now be described while referring to FIG. 3.

Figure 3:
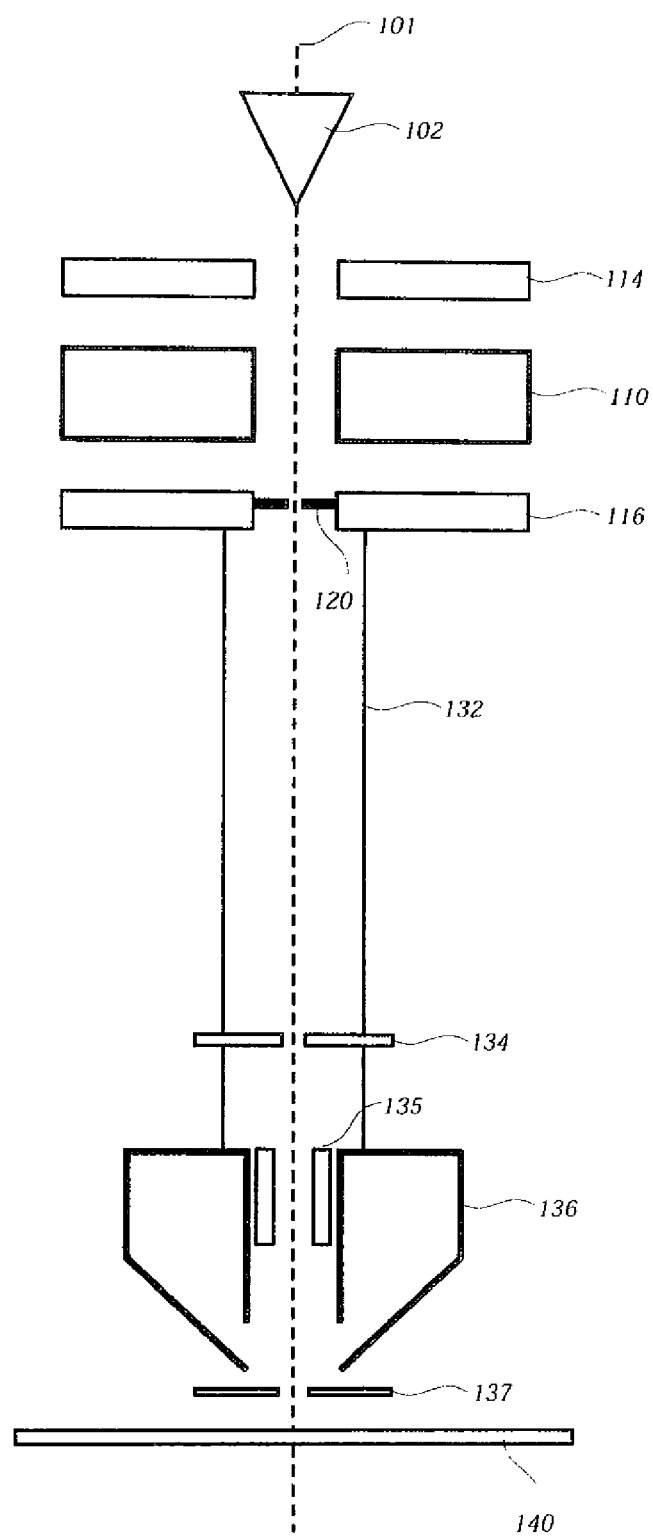
FIG. 3 is a schematic drawing of a charged particle beam device according to an embodiment of the present invention.

Similar to FIG. 2, the embodiment of FIG. 3 shows an emitter 102, an extractor 114, a deflector unit 110, and an electrode 116 with an aperture/diaphragm 120. The extractor 114, the deflector unit 110, and the electrode may form a gun lens, Further, FIG. 3 shows a tube 132, which may be used to accelerate the electrons to a high potential. This beam boost may reduce electron-electron-interaction. If the electrons are already accelerated, e.g., by an immersion lens as the gun lens, tube 132 may keep the electrons at the high potential.

The charged particle beam may be focused on specimen 140 by an objective lens. As an example, the objective lens is shown as a combined magnetic-electrostatic lens, including a magnetic part 136 and an electrostatic part that is fanned by the retarding electrode 137 and the above-mentioned high potential provided by tube 132. However, it is to be understood that other lenses may also be used. Electrostatic lenses, which may typically be Einzel-lenses or immersion lenses, may also be employed. Magnetic lenses or other types of combined magnetic-electrostatic lenses may also be employed.

FIG. 3 also shows a scan deflector 135, which may be used to scan the electron beam over the specimen. Scan deflectors 135 may include scan coils for magnetic deflection of the electron beam. Due to impingement of the portion of the emitted electrons that have passed through the diaphragm 120 on the specimen 140, secondary electrons or other particles, such as backscattered electrons, Auger electrons, photons or X-rays, may be released. The electrons may be accelerated through the objective lens by electrode 137 and may be detected by detector 134.

In the event no objective lens is provided and the gun lens is used to focus the primary charged particle beam on the specimen 140, the deflector 135 and the detector 134 may be positioned between the diaphragm 120 and the specimen 140.

Referring to the above-mentioned measurement of the amount of electrons which pass through the diaphragm 120, the amount of detected secondary electrons may be used as an indirect indicator for the current passing through the diaphragm 120. Therefore, the above described method may be modified as follows. The deflector unit 110 may be used to scan the emission pattern of the emitter 102 over the aperture 120. While the portion of the electrons passing through the aperture generates secondary electrons upon impingement on the specimen 140, the secondary electrons may be detected by detector 134. The scan signal of the deflector unit 110 and the signal detected by detector 134 may be used to generate an image of the emission pattern.

Generally, the examples described above can be summarized as follows. The charged particle beam may be emitted by an emitter 102, typically a field emitter or another emitter (nanotubes or the like) with non-continuous emission patterns. A deflector unit 110 may be operated to scan the emitted charged particles over the diaphragm. The diaphragm may have a size to let a part of the charged particle beam pass through the opening therein and to block another part of the charged particle beam. Optionally, the gun lens may be used to change the resolution and/or the magnification of the charged particle beam scanned over the diaphragm. In a further step, the current or the amount of charge passing through the diaphragm may be measured. This may be realized with a detector subsequent to the diaphragm, which may measure the charged particle beam directly, or with an indirect measurement, such as the detection of secondary particles released upon impingement of the charged particle beam to be measured. An image of the emission pattern may be obtained by evaluating the amount of particles, which has passed through the diaphragm, as a function of the amount of deflection introduced by the deflector unit 110. To determine the amount of deflection, the scan signal for the deflector unit may be utilized.

With the obtained emission pattern, a method for operating the charged particle beam apparatus may further be conducted. The charged particle beam may be emitted by an emitter 102, typically a field emitter or another emitter with noncontinuous emission patterns. A part of the charged particle beam may be selected by controlling the deflector unit 110 such that desired charged particles pass through the diaphragm. The charged particles of the selected emission area may be focused and/or scanned over a specimen to be tested or inspected. Secondary and/or back scattered charged particles, photons or X-rays may be detected by a detector in an effort to obtain a measurement result from the specimen to be tested or inspected, It is to be understood that this method may not only be applied for methods imaging a specimen, but also for lithography methods and lithography apparatuses, which may use the charged particle beam to pattern a mask, a substrate, or the like. A focused ion beam (FIB) device is an example of a system using an ion emitter.

Depending on the desired application, the emitter may either be an electron emitter or an ion emitter. There are also different types of ion emitters which have a non-continuous emitter pattern and for which apparatuses and methods according to embodiments of the present invention may be used. Generally, embodiments of the present invention relate to those devices and methods with emitters having a non-continuous emission pattern. Thereby, non-continuous may be understood as having a plurality of distinct emission areas (e.g., crystallographic surfaces) whereby a distinct emission may be assigned to a distinct emission area. The different emission areas may form an emission pattern. A part of the charged particle emission from the whole emission pattern may be selected. The other parts of the charged particle beam may be blocked.

A non-continuous emission pattern means that the common "bell-shaped" emission distribution starting from the emitter tip does not apply. Instead emitters having an emission pattern starting from its tip region, which may show at least two emission peaks in their emission characteristics, may be considered. At least two peaks may suggest mean that in the 3-dimensional emission characteristic irradiating from the tip region (in which the field strength is highest) at least two directions can be found, which have a direction of less emission current density between those two directions. There are at least two local maxima in emission. Thus, generally, the non-continuance emission pattern may also be regarded as intermittent or sporadic.

Figure 4A:
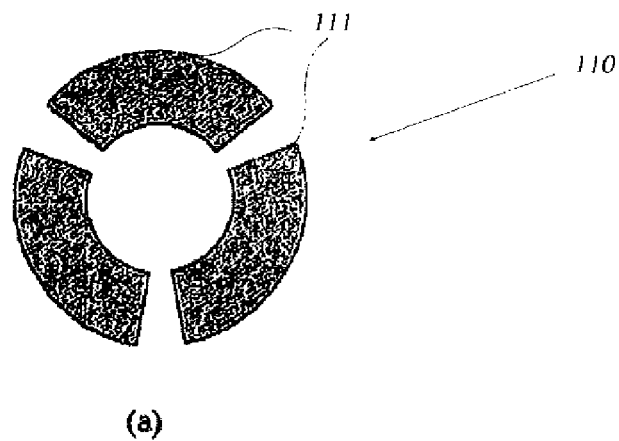
FIGS. 4a to 4c show deflector units to be positioned in the gun region according to embodiments of the present invention.
Figure 4B:
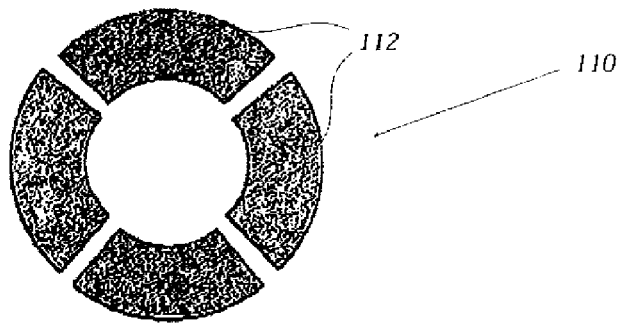
Figure 4C:
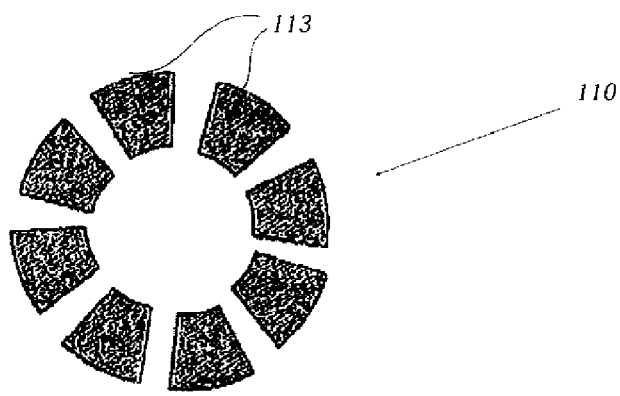

FIGS. 4a to 4c show embodiments of deflector units 110. FIG. 4a shows an embodiment including a multipole element with three segments 111. The three segments 111 may enable the deflector unit 110 to deflect the electron beam two-dimensionally in a plane essentially perpendicular to the optical axis 101 (see FIG. 3). Thereby, a two-dimensional image of the emission pattern may be generated.

The segments 111 may be electrostatic, magnetic, or combined magnetic-electrostatic. In view of the fact that the deflector unit 110 including the segments 111 is typically positioned close to the emitter, the deflector unit may need to be within UHV. Therefore, it may be considered advantageous in this case for the multipole element to be electrostatic.

According to another embodiment shown in FIG. 4b, the deflector unit 110 may include a multipole element with four segments 112. Again, the multipole element may be electrostatic, magnetic, or combined magnetic-electrostatic. This quadrupole element may also be capable of deflecting the emitted electron beam in two directions (x-y-plane, where the z-axis is denoted as the optical axis) over the diaphragm. FIG. 4c shows a further embodiment with an octupole as a multiple element. The octupole may include eight segments 113, wherein each segment of the multipole element may be electrostatic, magnetic, or combined magnetic-electrostatic.

Figure 5:
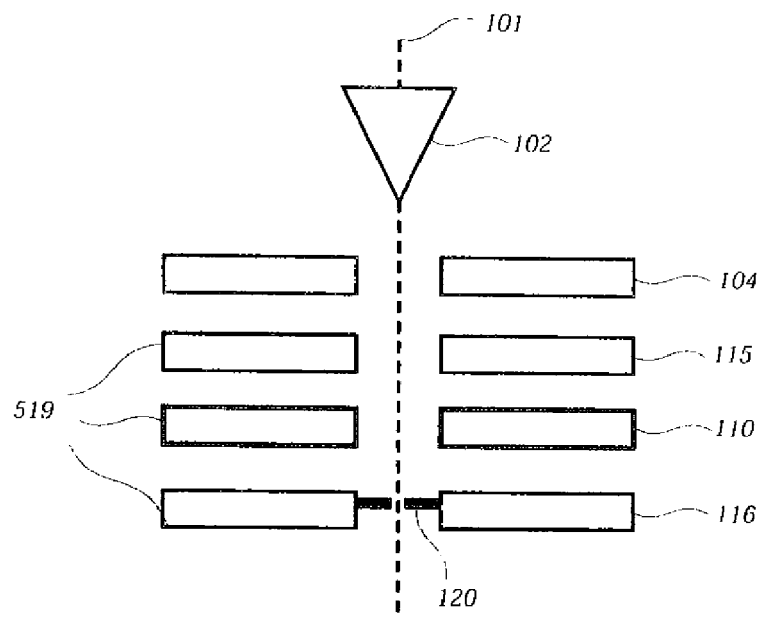
FIG. 5 is a schematic drawing of a gun region wherein a deflector unit and an electrode with a diaphragm is integrated in the gun lens according to an embodiment of the present invention.

FIG. 5 shows an alternate arrangement of a beam apparatus according to other embodiments. An emitter 102 may be positioned essentially on optical axis 101. The emitter, which may typically be a field emitter, may emit electrons by the combined action with extractor 104. When applying a voltage to the cold field emitter, a very high electric field may be formed at the emitter tip due to its small curvature. The strong electric field may enable the electrons to surpass the potential barrier between the metal and the vacuum in which the cold field emitter is placed. Accordingly, the established electric field is often referred to as an electric extractor field as it causes the electrons to be "extracted" from the emitter tip. Thereby, the field emitter 102 and the extractor 104 may be provided as one pre-assembled or combined package.

A gun lens 519 may be provided by components 115, 110, and 116. In this embodiment, electrode 115, deflector unit 110, and electrode 116 form an Einzel-lens. The deflector unit 110 may be integrated in the gun lens 519 and may be capable of scanning the emission pattern of emitter 102 over diaphragm 120. With this arrangement, the gun lens 519 and the deflector unit 110 may be close to the emitter. On the one hand, therefore, a gun lens acting as a condenser lens may be provided with a short focal length. On the other hand, the deflection and selection of parts of the electron beam may also be realized close to the emitter. Thereby, the beam current within the rest of the column may be reduced. Thus, negative influences from electron-electron-interactions may also be reduced.

In order to select the desired area of the emission pattern, the beam may be deflected by deflector unit 110 such that the desired area of the emission pattern passes through diaphragm 120. However, such a beam may be unsuitably deflected with respect to the optical axis 101. The embodiment shown in FIG. 6, therefore, includes a double deflector with deflectors 151 and 152. The deflectors 151, 152 may be used in an effort to align the portion of the electron beam passing through the diaphragm 120 with respect to the optical axis 101. The deflectors 151, 152 may either be electrostatic, magnetic, or combined magnetic-electrostatic. The alignment of the electronic beam may be realized by controlling the first deflector 151 such that the electron beam is directed onto the optical axis 101 within the second deflector 152. The second deflector may then be used to change the direction of the electron beam along the optical axis 101. Generally, since the deflection action, which is introduced by deflector unit 110, away from the optical axis 101 may be two-dimensional in a plane perpendicular to the optical axis 101, the double deflector unit 151, 152 may also be capable of deflecting the electron beam in two directions perpendicular to the optical axis 101. Whether or not the deflection takes place in one or two directions may depend on the area of the emission pattern that has been selected to pass through the diaphragm 120.

For emission sources like a cold field emitter (CFE) which may emit in different directions, the tip may be imaged, and the appropriate part of the emission may be selected. According to embodiments of the invention, a portion of the emitted charged particle corresponding to an emission area may be selected by deflecting the emission pattern of the field emitter over a diaphragm. Thereby, having the pivot-point at the position of the emitter may be preferred. Accordingly, either a deflector would be required within the emitter or a two-stage deflector would be required directly after the emitter and before the gun/condenser lens. The first option cannot be realized and the second option may likely increase the distance of the condenser lens from the emitter. As a consequence, the focal length, and thus, the aberration of the condenser lens may increase. In view of the above, according to embodiments of the present invention, the deflector unit for scanning the emission pattern over the diaphragm may be integrated into gun lens, or a single-stage deflector may be positioned between the emitter and the gun lens.

The term integrated is to be understood such that the gun lens comprises the deflector unit. That is, the deflector unit may be provided as an additional electrode within the gun lens, or the deflector may form a part of the gun lens, preferably, for example, the middle electrode. In the latter case a component of the gun lens may be replaced by the deflector unit.

Figure 6:
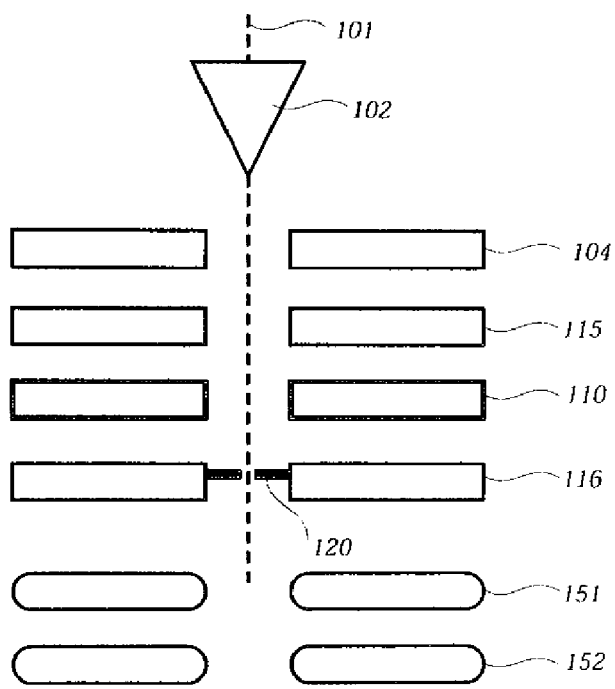
FIG. 6 is a schematic drawing of a gun region wherein a deflector unit and an electrode with a diaphragm is integrated in the gun lens and a double deflector for beam alignment is provided according to an embodiment of the present invention.
Figure 7:
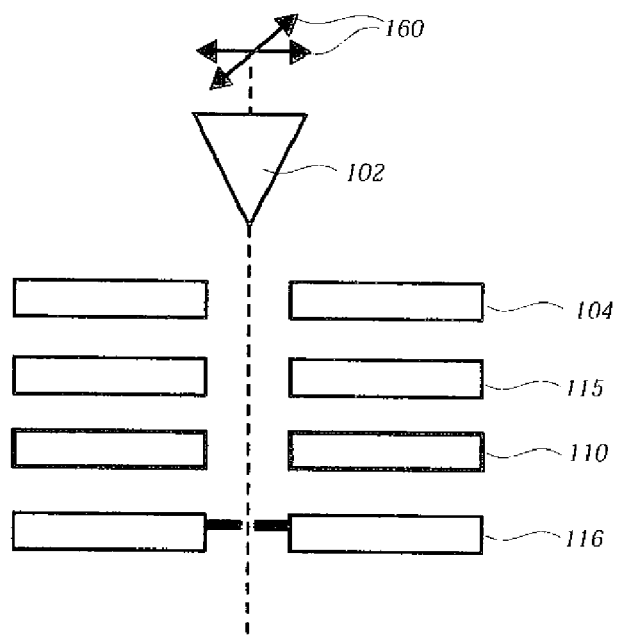
FIG. 7 is a schematic drawing of a gun region wherein a deflector unit and an electrode with a diaphragm is integrated in the gun lens and a displacement unit for the emitter is provided according to an embodiment of the present invention.

In the embodiment of FIG. 6, the middle electrode of a conventional gun lens is replaced by a multipole element that forms the deflector unit 110. The multipole element may, for example, be electrostatic. In order to compensate for misalignments with respect to the optical axis 101 introduced by selecting the desired part of the electron beam, a further deflection system may be included after the diaphragm 120. In another embodiment shown in FIG. 7, the shift of the electron beam introduced by deflector unit 110 may be further combined with the shift of the electron beam introduced by a mechanical displacement of the emission tip. The displacement unit 160 may enable the emitter 102 to be moved, for example, in two directions perpendicular to the optical axis. The combined action of the mechanical shift of the emitter 102 and the deflection of the electron beam may improve the capability of selecting a certain emission area of the emission pattern precisely.

Figure 8:
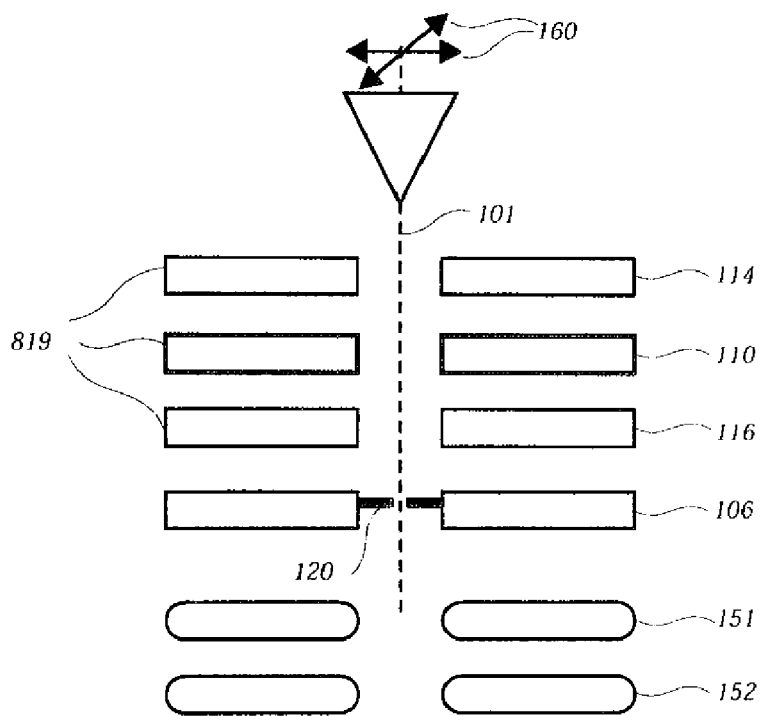
FIG. 8 is a schematic drawing of a gun region wherein a deflector unit and an extractor is integrated in the gun lens and wherein a double deflector for beam alignment and a displacement unit for the emitter is provided according to an embodiment of the present invention.

According to yet another embodiment shown in FIG. 8, the displacement unit 164 shifting the emission tip, the deflector unit 110 and the double deflector 151, 152 may be combined. This may enable a precise selection of the desired emission area of the emission pattern by the combined mechanical shift of the emission tip and an electrical shift of the deflector unit 110, as well as a beam alignment to the optical axis 101 after the aperture 120. Within FIG. 8, the gun lens may be constituted by components 114, 110, and 116. Electrode 106, including diaphragm 120, may be positioned (immediately) after the gun lens.

The mechanical shift, the electrical shift and/or the alignment after the diaphragm may be designed to have a selected part of the emission pattern raster-scanned essentially straight and essentially on the optical axis (i.e., through the center of the lens) through the diaphragm.

The apertures/diaphragms 120 of the above mentioned embodiments may typically have a circular shape. However, if desired for the individual application, also slit-shaped diaphragms may also be used. The diameter of circular apertures may be in the range of about 1 μm to about 100 μm, preferably in the range of about 5 μm to about 50 μm. In the event that slit shaped apertures are used, the width of the slit may be in the range of about 1 μm to about 100 μm, preferably in the range of about 5 μm to about 50 μm. The length of the slit may be up to several millimeters (e.g., 2 mm).

Figure 9:
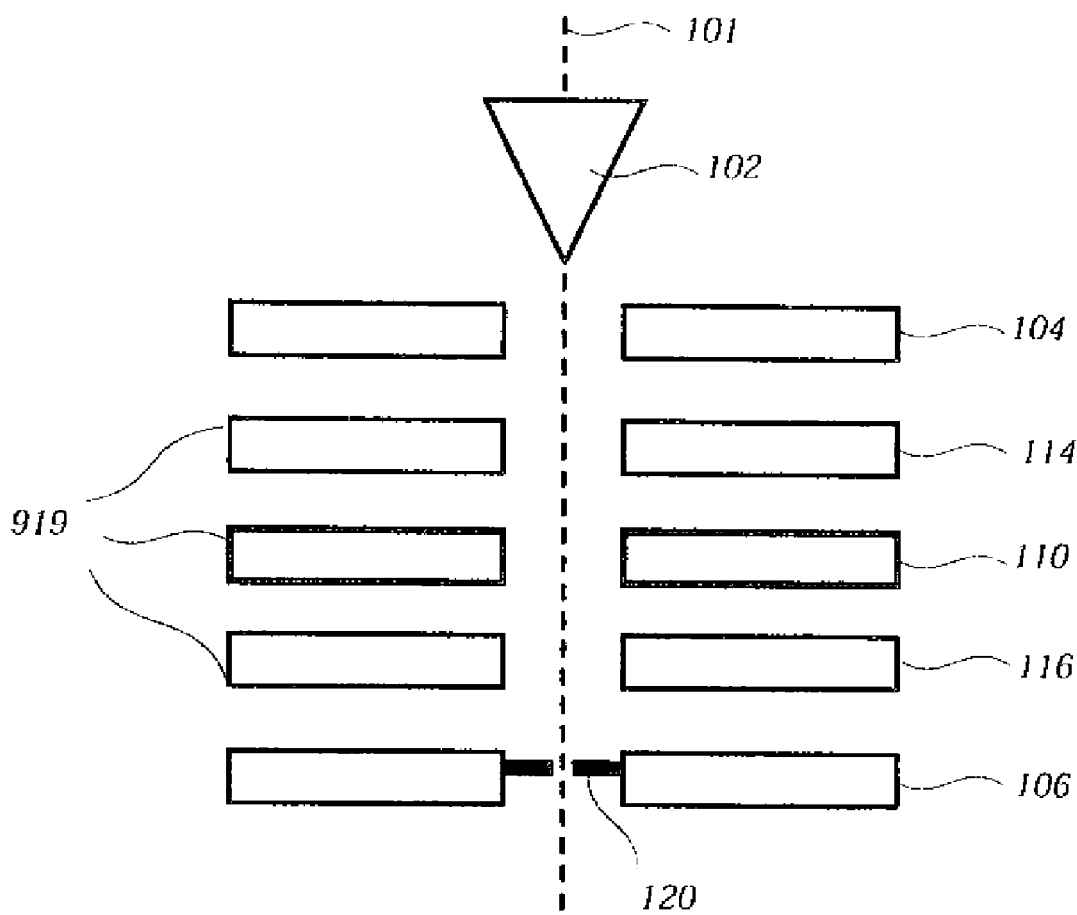
FIG. 9 is a schematic drawing of a gun region wherein a deflector unit is integrated in the gun lens according to an embodiment of the present invention.

Within the embodiments described with respect to FIGS. 2 to 8, the gun lens, which typically constitutes a condenser lens, includes the deflector unit 110 or the deflector as a part of the gun lens. Further, within some of these embodiments an electrode 116, including the diaphragm 120, is also incorporated in the gun lens. The same applies for the extractor 114 which is incorporated in the gun lens in some embodiments. Both, electrode 106 and extractor 114 are also shown as not being a part of the gun lens in other embodiments. FIG. 9 shows an embodiment where the extractor 104 and the electrode 106 are separated from the gun lens 119. Gun lens 119 may include electrodes 114 and 116 as well as deflector unit 110. Thereby, electrode 114 may be used as a second extractor (anode) for the field emitter 102.

According to a further embodiment (not shown), the deflector unit 110 may also be positioned above the gun lens. In such a case, the deflector 110 is positioned between the gun lens and the emitter 102.

For some embodiments of the invention, high precision lenses, as disclosed in EP 1530229, for example, may also be used. This application filed on Nov. 4, 2003 is herein incorporated in its entirety by reference. Therein, the lenses are disclosed to have a first element having a first opening for acting on said charged particle beam; at least a second element for acting on said charged particle beam; at least one distance piece positioned between said first element and said at least second element to provide for a minimum distance between said first element and said second element; and a first holding piece for abutting said first element to said at least one distance piece, whereby said first holding piece is attached to said at least one distance piece. The distance and holding pieces allow for a high precision alignment of a first electrode or pole piece with respect to a second electrode or pole piece.

Individual embodiments of the present invention may further include individual features or feature combinations of the following details. The deflector unit may be positioned between the emitter and the gun lens. The deflector unit may also be integrated in the gun lens, wherein the deflector unit is adapted to direct an emission peak of the at least two emission peaks to an opening of the diaphragm to thereby select the emission peak of the at least two emission peaks from the emission pattern. The deflector unit may be positioned within a distance of about 30 mm or less from the emitter. The deflector may be a field emitter. The diaphragm may be positioned after the deflector unit and may be adapted to have the plurality of emission areas to be scanned over the opening of the diaphragm by the deflector unit. The diaphragm may be integrated in the last electrode of the gun lens. The charged particle beam device may include an extractor for extracting the charged particles from the emitter. The extractor may be integrated in the gun lens and may additionally be adapted to form the first electrode of the gun lens. The deflector units may include a multipole element either with at least three segments, or being a quadrupole element or an octupole element. The multipole element may be integrated in the gun lens and may additionally be adapted to form the middle electrode of the gun lens. The deflector unit may be electrostatic, whereas, independent therefrom, the gun lens may be electrostatic, magnetic, or combined electrostatic-magnetic. The devices may further include a displacement unit for mechanically shifting the emitter in a plane essentially orthogonal to the optical axis and/or a detector for measuring the charged particle current passing through the diaphragm. The detector may be a faraday-cup positioned after the diaphragm. Alternatively or additionally, a detector measuring secondary electrons released from a specimen on impingement of the charged particles emitted by the emitter may be provided. Further a double deflector positioned after the diaphragm for alignment of the charged particle beam along the optical axis may be included.

Further one of the following steps or a combination of the following steps may be applied for any of the methods. The measured value corresponding to the current passing through the aperture may be the current and/or the charge passing through the aperture. Alternatively or additionally, this value may be an indirect measurement result correlating to the current of the charged particle beam passing through the diaphragm, especially a detection signal of secondary electrons released upon impingement of the charged particles on a solid body. Further, the charged particle beam may be focused with a gun lens. The emitter may be moved in a plane essentially perpendicular to an optical axis. The charged particle beam may be deflected within the gun lens and may additionally be deflected with a component of the gun lens. The emitter may be moved in a plane essentially perpendicular to an optical axis. Further, the charged particle beam having passed through the diaphragm may be aligned to the optical axis. The charged particle beam may be deflected within the gun lens and/or within a distance of about 30 mm or less from the emitter. The charged particles may be emitted by applying an extraction field between a field emitter and an extractor.

Having thus described the invention in detail, it should be apparent for a person skilled in the art that various modifications can be made in the present invention without departing from the spirit and scope of the following claims.

The invention claimed is:

1. A charged particle beam apparatus comprising:
   an emitter with an emitter tip emitting an emission pattern including at least two emission peaks such that at least two emission directions can be found;
   a gun lens; and
   a diaphragm, wherein the gun lens comprises an electrostatic deflector unit, the deflector unit is a middle electrode of the gun lens and being adapted to deflect the entire pattern and to thereby direct one emission peak of the at least two emission peaks to an opening of the diaphragm to thereby select the one emission peak of the at least two emission peaks from the emission pattern.

2. The charged particle beam apparatus according to claim 1, wherein the deflector unit is positioned within a distance of about 50 mm or less from the emitter.

3. The charged particle beam apparatus according to claim 1, wherein the gun lens is positioned within a distance of about 50 mm or less from the emitter.

4. The charged particle beam apparatus according to claim 1, wherein the deflector unit is positioned between the emitter and the diaphragm.

5. The charged particle beam apparatus according to claim 1, wherein the emitter is a field emitter.

6. The charged particle beam apparatus according to claim 1, wherein the diaphragm is positioned after the deflector unit and is adapted to have a plurality of emission areas to be scanned over the opening of the diaphragm by the deflector unit.

7. The charged particle beam apparatus according to claim 1, wherein the diaphragm is integrated in a last electrode of the gun lens.

8. The charged particle beam apparatus according to claim 1, further comprising an extractor for extracting the charged particles from the emitter.

9. The charged particle beam apparatus according to claim 8, wherein the extractor is integrated in the gun lens.

10. The charged particle beam apparatus according to claim 8, wherein the extractor is adapted to form a first electrode of the gun lens.

11. The charged particle beam apparatus according to claim 1, wherein the deflector unit comprises a multipole element with at least three segments.

12. The charged particle beam apparatus according to claim 11, wherein the multipole element is a quadrupole element.

13. The charged particle beam apparatus according to claim 11, wherein the multipole element is an octupole element.

14. The charged particle beam apparatus according to claim 11, wherein the multipole element is adapted to form a middle electrode of the gun lens.

15. The charged particle beam apparatus according to claim 1, wherein the gun lens is electrostatic or combined electrostatic-magnetic.

16. The charged particle beam apparatus according to claim 1, further comprising a displacement unit for mechanically shifting the emitter in a plane essentially orthogonal to an optical axis of the charged particle beam apparatus.

17. The charged particle beam apparatus according to claim 1, further comprising a detector for measuring a charged particle current passing through the diaphragm.

18. The charged particle beam apparatus according to claim 17, wherein the detector is a Faraday-cup positioned after the diaphragm.

19. The charged particle beam apparatus according to claim 17, wherein the detector measures secondary electrons released from a specimen upon impingement of charged particles emitted by the emitter.

20. The charged particle beam apparatus according to claim 17, further comprising a measured current signal detected by the detector and a scan signal for operating the detector.

21. The charged particle beam apparatus according to claim 20, further comprising imaging means for generating an image of the emission pattern based on the current signal and the detector signal.

22. The charged particle beam apparatus according to claim 1, further comprising a double deflector positioned after the diaphragm for alignment of a charged particle beam along an optical axis of the charged particle beam apparatus.

23. The charged particle beam apparatus according to claim 1, further comprising:
   a specimen stage for holding a specimen to receive a charged particle beam.

24. The charged particle beam column according to claim 23, further comprising an objective lens for focusing the charged particle beam on the specimen.

25. A method for measuring an emission pattern of an emitter, comprising:
   providing an emitter with an emitter tip emitting an emission pattern including at least two emission peaks such that at least two emission directions can be found;
   deflecting the emission pattern of a charged particle beam over an opening of a diaphragm;

focusing the charged particle beam with a gun lens, the gun lens comprising an electrostatic deflector unit adapted to deflect the entire pattern and to thereby direct one emission peak of the at least two emission peaks to the opening of the diaphragm, thereby selecting the one emission peak of the least two emission peaks from the emission pattern;

measuring a value correlated to a charged particle current passing through the diaphragm; and evaluating the value as a function of the deflected emission pattern.

26. The method according to claim 25, wherein the value is the current and/or a charge passing through the diaphragm.

27. The method according to claim 25, wherein the value is an indirect measurement result correlated to the current of the charged particle beam passing through the diaphragm.

28. The method according to claim 25, wherein the value is a detection signal generated by secondary electrons released upon impingement of charged particles on a solid body.

29. The method according to claim 25, further comprising moving the emitter in a plane essentially perpendicular to an optical axis.

30. The method according to claim 25, wherein the charged particle beam is deflected within the gun lens.

31. The method according to claim 25, wherein the charged particle beam is deflected by a component of the gun lens.

32. A method of selecting an emission peak of an emission pattern, comprising:

providing an emitter with an emitter tip emitting an emission pattern including at least two emission peaks such that at least two emission directions can be found;

electing one emission peak of the emission pattern;

deflecting a charged particle beam having the emission pattern to allow the elected emission peak to pass through an opening of a diaphragm; and focusing the charged particle beam with a gun lens, the gun lens comprising an electrostatic deflector unit adapted to deflect the entire pattern and to thereby direct the one emission peak of the at least two emission peaks to the opening of the diaphragm, thereby selecting the one emission peak of the at least two emission peaks from the emission pattern.

33. The method according to claim 32, further comprising moving the emitter in a plane essentially perpendicular to an optical axis.

34. The method according to claim 32, further comprising aligning the charged particle beam having passed through the diaphragm to an optical axis.

35. The method according to claim 32, wherein the charged particle beam is deflected within a gun lens.

36. The method according to claim 32, wherein the charged particle beam is deflected by a component of a gun lens.

37. The method according to claim 32, wherein the charged particle beam is deflected within a distance of about 30 mm or less from the emitter.

38. The method according to claim 32, wherein the charged particle beam is emitted by applying an extraction field between a field emitter and an extractor.

39. The method according to claim 32, further comprising operating the gun lens to focus the charged particle beam on a specimen.

40. The method according to claim 32, further comprising operating an objective lens to focus the charged particle beam on a specimen.

* * * * *